_(12)_ United States Patent
Chang et al.

(10) Patent No.: US 7,486,086 B2
(45) Date of Patent: Feb. 3, 2009

(54) METHOD FOR MEASURING INTRINSIC CAPACITANCE OF A METAL OXIDE SEMICONDUCTOR (MOS) DEVICE

(75) Inventors: Yao-Wen Chang, Hsinchu (TW); Hsing-Wen Chang, Miaoli (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/979,576

(22) Filed: Nov. 6, 2007

(65) Prior Publication Data

US 2008/0106274 A1     May 8, 2008

(30) Foreign Application Priority Data

Nov. 6, 2006   (TW) .............................. 95141047 A

(51) Int. Cl.
       *G01R 27/26*      (2006.01)
(52) U.S. Cl. .................. 324/658; 324/678; 324/765; 324/769; 324/652; 324/687; 331/57
(58) Field of Classification Search ................ 324/658, 324/687, 769; 257/235, 236, 237, 238, 239
       See application file for complete search history.

(56) References Cited

U.S. PATENT DOCUMENTS

| 5,773,317 | A  | * | 6/1998 | Wu et al. ...................... 438/17 |
| 5,999,010 | A  | * | 12/1999 | Arora et al. .................. 324/765 |
| 6,366,098 | B1 | * | 4/2002 | Froment ....................... 324/678 |
| 6,404,222 | B1 | * | 6/2002 | Fan et al. ..................... 324/765 |
| 6,456,105 | B1 | * | 9/2002 | Tao ............................. 324/769 |
| 6,549,029 | B1 | * | 4/2003 | Hsieh et al. .................. 324/769 |
| 6,750,673 | B1 | * | 6/2004 | Huang et al. ................. 324/769 |
| 6,756,792 | B2 | * | 6/2004 | Armbruster ................. 324/687 |
| 6,885,214 | B1 | * | 4/2005 | Su et al. ....................... 324/765 |
| 7,068,061 | B2 | * | 6/2006 | Tanida et al. ................. 324/765 |

(Continued)

FOREIGN PATENT DOCUMENTS

DE            3917706        * 10/1990

OTHER PUBLICATIONS

Yang, Kevin J., and Hu, Chenming, MOS Capacitance Measurements for High Leakage Thin Dielectrics, IEEE Transactions on Electron Devices, vol. 46, No. 7, Jul. 1999, p. 1500-1501.*

*Primary Examiner*—Diego Gutierrez
*Assistant Examiner*—Benjamin M Baldridge
(74) *Attorney, Agent, or Firm*—Bacon & Thomas PLLC

(57) ABSTRACT

A method for measuring intrinsic capacitance of a MOS device is provided. The MOS device includes a first terminal, a second terminal, a third terminal and a fourth terminal. First, provide a first input signal to the second terminal and ground the third terminal and fourth terminal. Then, charge the first terminal and measure a first current required for charging the first terminal. Afterward, provide a second input signal to the second terminal, ground the third terminal and the fourth terminal, and measure a second current required for charging the first terminal, wherein the first input signal and the second input signal have the same low level, but different high levels. Finally, determine intrinsic capacitance between the first terminal and the second terminal according to the first current, the second current and a high level difference between the first input signal and the second input signal.

10 Claims, 10 Drawing Sheets

U.S. PATENT DOCUMENTS

| | | | |
|---|---|---|---|
| 7,088,123 B1 * | 8/2006 | Yang et al. | 324/765 |
| 7,112,982 B2 * | 9/2006 | Honda et al. | 324/765 |
| 7,265,639 B2 * | 9/2007 | Bhushan et al. | 331/57 |
| 7,385,405 B2 * | 6/2008 | Chen | 324/652 |
| 2003/0227291 A1 * | 12/2003 | Okagaki et al. | 324/658 |
| 2007/0162879 A1 * | 7/2007 | Tiwari | 716/4 |

* cited by examiner

METHOD FOR MEASURING INTRINSIC CAPACITANCE OF A METAL OXIDE SEMICONDUCTOR (MOS) DEVICE

This application claims the benefit of Taiwan application Serial No. 95141047, filed Nov. 6, 2006, the subject matter of which is incorporated herein by reference.

BACKGROUND OF THE INVENTION

1. Field of the Invention

The invention relates in general to a method for measuring intrinsic capacitance of a metal oxide semiconductor (MOS) device, and more particularly to a method for measuring intrinsic capacitance of a short-channel MOS device.

2. Description of the Related Art

In a radio-frequency (RF), analog or digital combination circuit, the accuracy of a capacitance model analysis for a MOS device is very essential to a circuit designer. For example, a normal MOS field effect transistor has overlap capacitance, junction capacitance and intrinsic capacitance.

Referring to FIG. 1, a schematic diagram of an equivalent circuit of a small-signal of MOS field effect transistor is shown. As shown in FIG. 1, in a MOS field effect transistor 100, the charge amount $Q_G$ of a terminal, such as the gate G, will be affected by variation of bias voltage of another terminal, such as $V_D$. The corresponding relationship can be represented by the intrinsic capacitance $$Cxy = -\frac{\partial Q_x}{\partial V_y}, x \neq y, \text{ and } C_{xx} = \frac{\partial Q_x}{\partial V_x},$$

wherein x and y can be a terminal D, G, S or B.

That is, the intrinsic capacitance $C_{GD}$ between the gate G and the drain D reflects the influence of the bias voltage $V_D$ of the drain D on the charge amount $Q_G$ of the gate G. This intrinsic capacitance is not linear and is still affected by the voltages at the other three terminals. Furthermore, the intrinsic capacitance cannot normally be measured accurately for further model analysis. Conventionally, a LCR meter combined by suitable software can only measure the intrinsic capacitance $C_{GX}$ of a long-channel MOS device.

SUMMARY OF THE INVENTION

The invention is directed to a method for measuring intrinsic capacitance of a MOS device. According to the method of the invention, it needs only a normal capacitance measurement circuit (such as a charge-based capacitance measurement circuit structure) to effectively measure intrinsic capacitance of even a short-channel MOS device with each terminal biased.

According to a first aspect of the present invention, a method for measuring intrinsic capacitance of a MOS device is provided. The MOS device comprises a first terminal, a second terminal, a third terminal and a fourth terminal, and the first terminal is coupled to a capacitance measurement circuit. To extract intrinsic capacitance $C_{GD}$ (G is the first terminal and D is the second terminal), ideally, we can first provide a first input signal to the second terminal and ground the third terminal and the fourth terminal. Following that, charge the first terminal to an operational voltage by using the capacitance measurement circuit and measure a first current required for charging the first terminal to the operational voltage. Afterward, provide a second input signal to the second terminal, ground the third terminal and the fourth terminal, and measure a second current required for charging the first terminal to the operational voltage, wherein the first input signal and the second input signal have the same low level, but different high levels. Then, we can determine intrinsic capacitance between the first terminal and the second terminal according to the first current, the second current and a high level difference between the first input signal and the second input signal.

According to a second aspect of the present invention, a method for measuring another intrinsic capacitance, $C_{GG}$, of a MOS device is provided. The MOS device comprises a first terminal, a second terminal, a third terminal and a fourth terminal, and the first terminal is coupled to a capacitance measurement circuit. First, provide a first input signal to the second terminal, the third terminal and the fourth terminal at the same time. Following that, charge the first terminal to an operational voltage by using the capacitance measurement circuit and measure a first current required for charging the first terminal to the operational voltage. Afterward, provide a second input signal to the second terminal, the third terminal and the fourth terminal, and measure a second current required for charging the first terminal to the operational voltage, wherein the first input signal and the second input signal have the same low level but different high levels and a difference between high levels of the first input signal and the second input signal is equal to the first voltage. Finally, determine intrinsic capacitance of the first terminal according to the first current, the second current and the first voltage.

The invention will become apparent from the following detailed description of the preferred but non-limiting embodiments. The following description is made with reference to the accompanying drawings.

DETAILED DESCRIPTION OF THE INVENTION

First Embodiment

In the first embodiment, the intrinsic capacitance $C_{GD}$ between the gate and the drain as mentioned above is taken as an example to illustrate the measuring method and related circuit structure of the invention.

Figure 1:
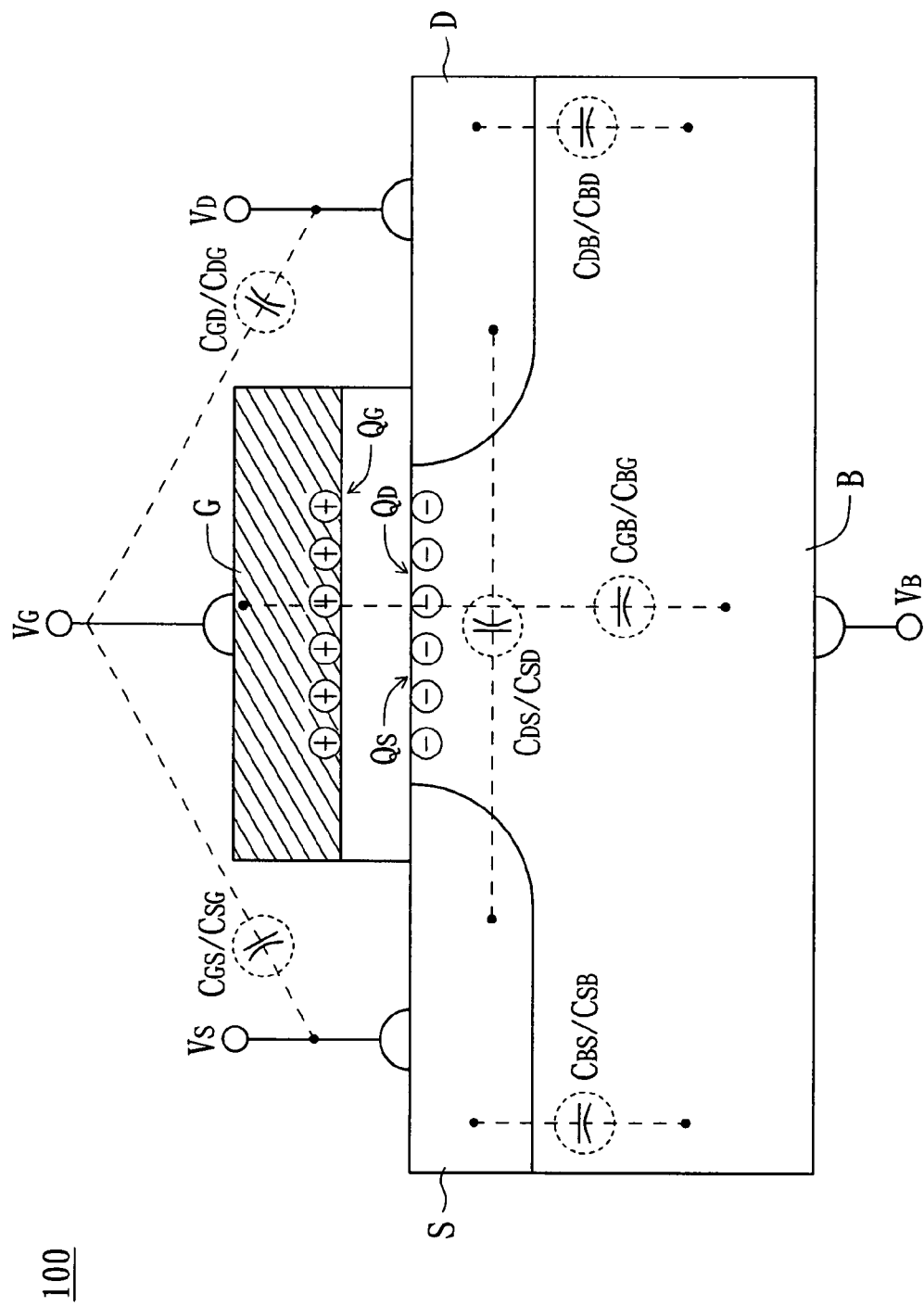
FIG. 1 is a schematic diagram of an equivalent circuit of a small-signal of MOS field effect transistor.
Figure 2A:
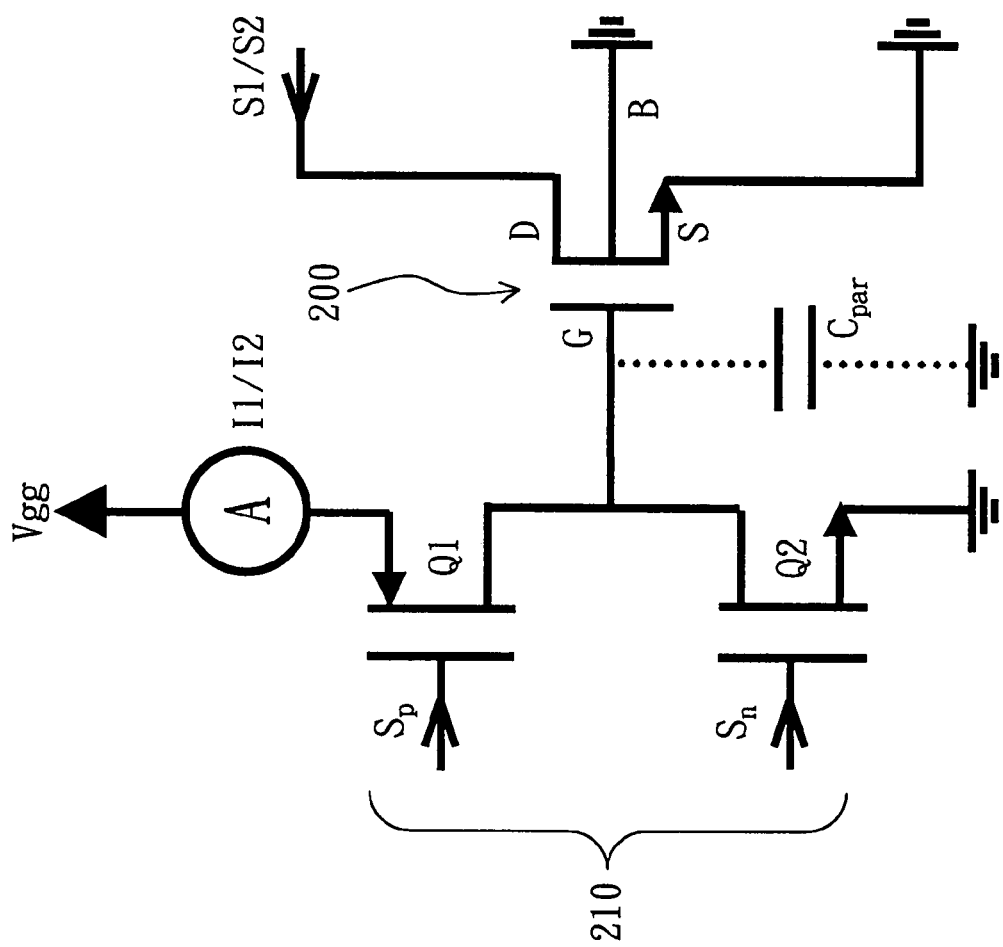
FIG. 2A is a schematic diagram of a circuit for measuring intrinsic capacitance of a MOS device according to a first embodiment of the invention.
Figure 2B:
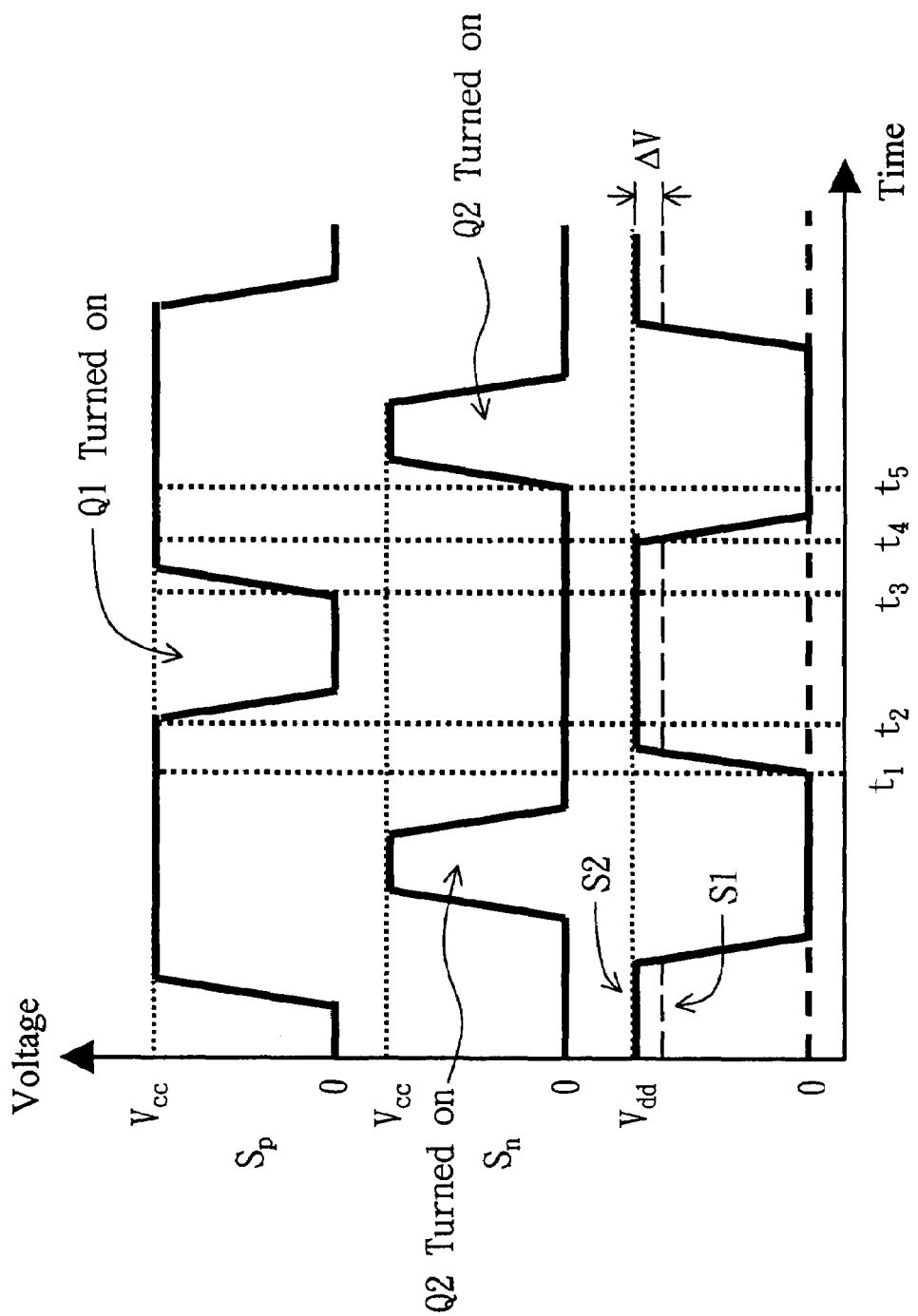
FIG. 2B is a timing diagram of four signals Sp, Sn, S1 and S2 of FIG. 2A in the ideal case.

Referring to FIGS. 2A and 2B, a schematic diagram of a circuit for measuring intrinsic capacitance of a MOS device according to a first embodiment of the invention and a timing diagram of four signals Sp, Sn, S1 and S2 of FIG. 2A are respectively shown. A MOS device 200, such as a normal MOS field effect transistor, has a first terminal G, a second terminal D, a third terminal S and a fourth terminal B. As shown in FIG. 2A, the first to the fourth terminals are respectively a gate, a drain, a source and a bulk.

Besides, the first terminal G of the MOS device 200 is coupled to a charge-based capacitance measurement (CBCM) circuit 210 consisted of a p-type MOS (PMOS) transistor and an n-type MOS (NMOS) transistor. In other embodiments, the MOS device 200 can also be coupled to any other type of capacitance measurement circuit. The source of the PMOS transistor Q1 is coupled to an operational voltage Vgg, such as 1V~3V. The first terminals G of the PMOS transistor, the NMOS transistor and the MOS device 200 are coupled together and there exists a parasitic capacitor Cpar at the coupling terminal G. The source of the NMOS transistor Q2 is grounded. The gates of the PMOS transistor Q1 and NMOS transistor Q2 are respectively inputted by a first control signal Sp and a second control signal Sn whose waveforms are shown in FIG. 2B; the second terminal D of the MOS device 200 can be selectively inputted by a first input signal S1 or a second input signal S2.

Figure 3:
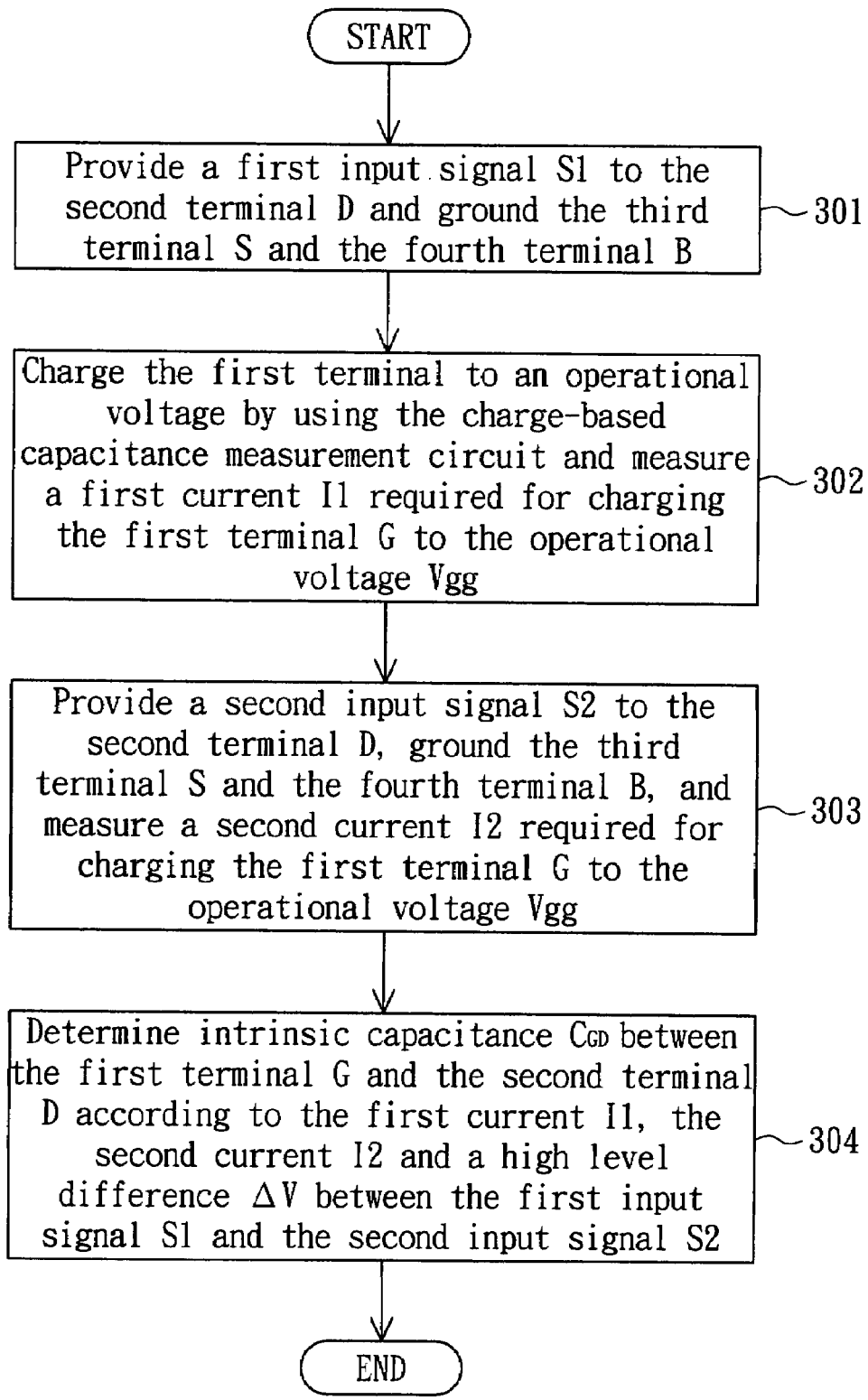
FIG. 3 is a flow chart of a method for measuring intrinsic capacitance $C_{GD}$ of a MOS device in the ideal case.

Referring to FIG. 3, a flow chart of a method for measuring intrinsic capacitance $C_{GD}$ of the MOS device 200 in the ideal case according to the first embodiment of the invention is shown. First, as shown in FIG. 3, in step 301, provide the first input signal S1 to the second terminal D and ground the third terminal S and the fourth terminal B.

Following that, in step 302, charge the first terminal G to the operational voltage Vgg by using the CBCM circuit 210 and measure a first current I1 required for charging the first terminal G to the operational voltage Vgg. As shown in FIG. 2A, the first terminal G is coupled to the operational voltage Vgg via the PMOS transistor Q1 and the CBCM circuit 210 charges and discharges the first terminal G of the MOS device 200 through a suitable configuration of the PMOS transistor Q1 and NMOS transistor Q2.

As shown in FIG. 2B, the first input signal S1 and the second input signal S2 have a low level 0, a high-level difference equal to ΔV, such as 0.1V, and the same frequency f. The first control signal Sp and the second control signal Sn have the same high level Vcc and low level 0, and the same frequency f. Besides, when the first control signal Sp has a low level, the PMOS transistor Q1 is enabled to turn on and the NMOS transistor Q2 is turned off; when the second control signal Sn has a high level, the NMOS transistor Q2 is enabled to turn on and the PMOS transistor Q1 is turned off. That is, the PMOS transistor Q1 and the NMOS transistor Q2 can be enabled by turns by using the first control signal Sp and the second control signal Sn. When the PMOS transistor Q1 is enabled, the first input signal S1 and the second input signal S2 have the high level. When the NMOS transistor Q2 is enabled, the first input signal S1 and the second input signal S2 have the low level. Therefore, for example, during the time between t1 and t2, the first input signal S1 is increased from a low level to a high level Vdd and maintains at the high level Vdd until the time t4. During the time between t2 and t3, the voltage of the first terminal G reaches the operational voltage Vgg through the turned-on PMOS transistor Q1.

At the time, as shown in FIG. 2A, measure the first current I1 flowing by the turned-on PMOS transistor Q1 and charging the first terminal G to the operational voltage Vgg. The value I1 is directly proportional to a sum of charge amount $Q_G$ accumulated at the first terminal G and charge amount accumulated on the parasitic capacitor Cpar when the bias $V_G$ of the first terminal G reaches Vgg in one period. That is:

$$I1/f = \int_0^{Vgg} C_{par} dV_G + \int_0^{Vgg} C_{GG} dV_G \bigg|_{Vdd}$$

$$= \int_0^{Vgg} C_{par} dV_G + Q_G \bigg| Vgg, Vdd$$

$Q_G$|Vgg,Vdd represents charges existing at the first terminal G when the voltages of the first terminal G and the second terminal D are Vgg and Vdd respectively.

Afterward, in step 303, provide the second input signal S2 to the second terminal D, keep the third terminal S and the fourth terminal B grounded, similarly, actuate the CBCM circuit 210 to charge the first terminal G to the operational voltage Vgg and measure a second current I2 required for charging the first terminal G. Owing that the only difference between the first and the second input signals S1 and S2 is that they have different high levels, similar to the above-mentioned equation of I1, I2 can be obtained by:

$$I2/f = \int_0^{Vgg} C_{par} dV_G + \int_0^{Vgg} C_{GG} dV_G \bigg|_{Vdd+\Delta V} = \int_0^{Vgg} C_{par} dV_G + Q_G \bigg| Vgg, Vdd + \Delta V$$

Finally, in step 304, according to the first current I1, the second current I2, and the difference ΔV between the high levels of the first input signal S1 and the second input signal S2, determine intrinsic capacitance $C_{GD}$ between the first terminal G and the second terminal D. According to the above equations, the value $C_{GD}$ can be obtained by:

$$-\frac{I2-I1}{f \times \Delta V} =$$

$$-[(Q_G | Vgg, Vdd + \Delta V) - (Q_G | Vgg, Vdd)]/\Delta V = -\frac{\Delta Q_G |_{Vgg,Vdd}}{\Delta V};$$

$$C_{GD} \bigg| Vgg, Vdd = -\frac{\partial Q_G}{\partial V_D}\bigg|_{Vgg,Vdd} \approx -\frac{\Delta Q_G |_{Vgg,Vdd}}{\Delta V} = (I1 - I2)/(f \times \Delta V)$$

Therefore, from the above equations, the intrinsic capacitance $C_{GD}$ can be determined in case that the operational voltage is Vgg and the voltage of the second terminal D is Vdd.

Figure 4A:
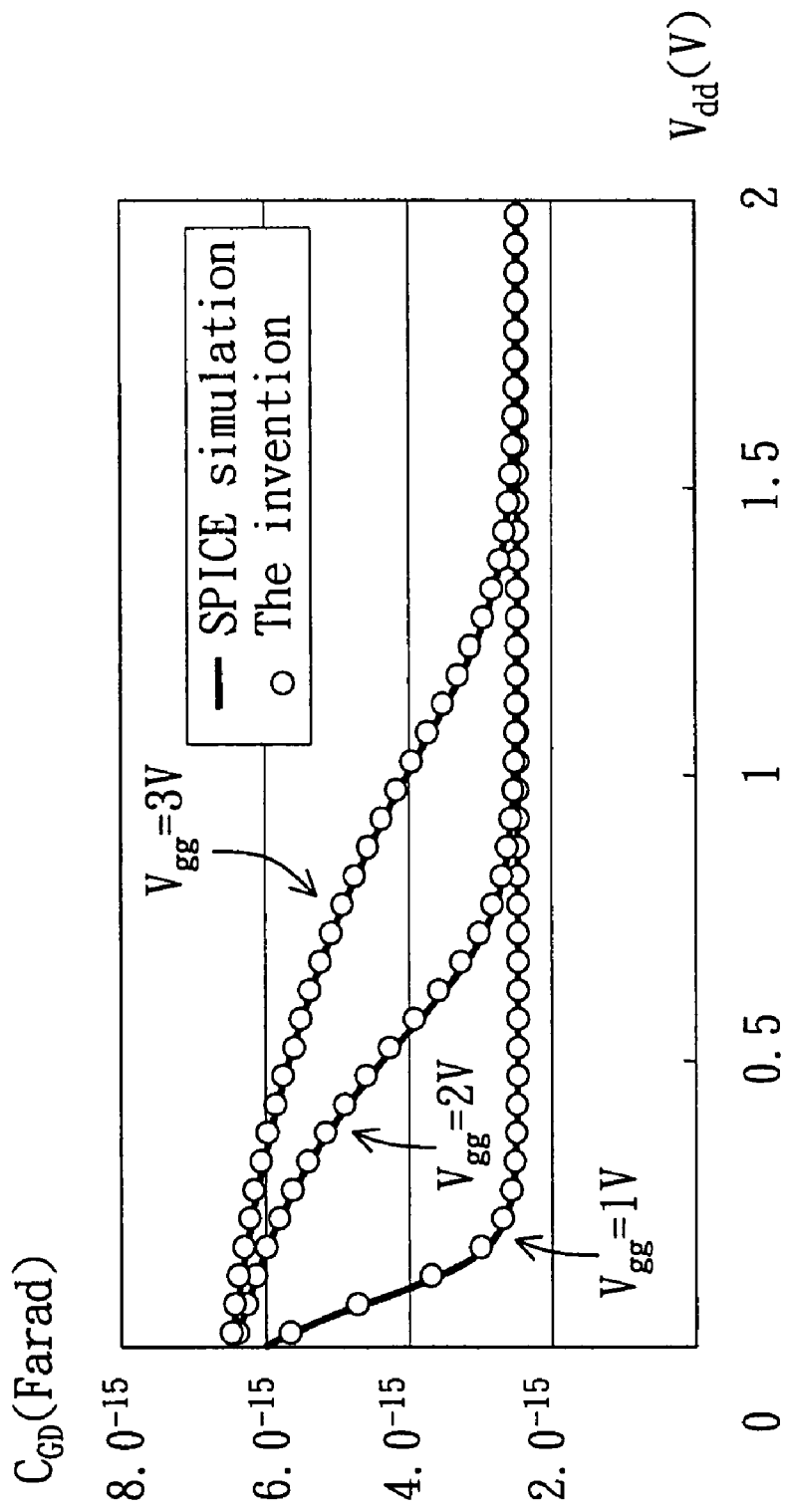
FIGS. 4A and 4B are two comparison diagrams of the values $C_{GD}$ and $C_{GS}$ respectively obtained by the ideal measuring method in the first embodiment of the invention and those resulted from SPICE simulation.
Figure 4B:
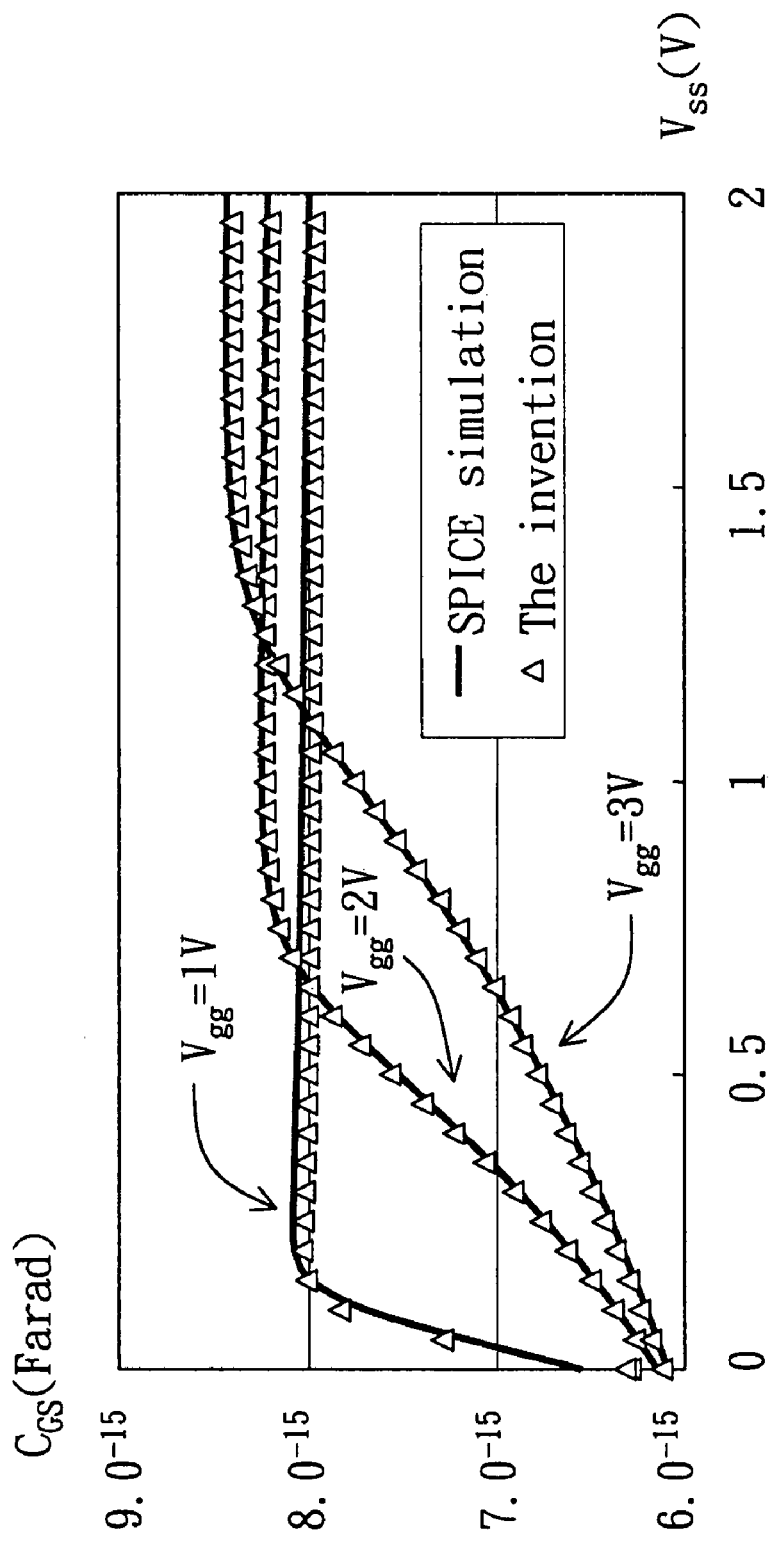

Referring to FIGS. 4A and 4B, two comparison diagrams of the values $C_{GD}$ and $C_{GS}$ respectively obtained by the measuring method of the first embodiment of the invention and those resulted from SPICE simulation are shown. As shown in FIG. 4A, the value $C_{GD}$ obtained by the above equation (I1−I2)/(f×ΔV) is almost the same as the SPICE simulation result. By the same method, the value $C_{GS}$ can also be obtained as shown in FIG. 4B and the curve obtained by SPICE simulation is also very similar. However, in the real testing environment, the first and second input signals are provided by a pulse generator. The intrinsic capacitance measurement should be done for the MOS device 200 at various bias conditions, including that condition, in which the MOS device 200 is turned on and there is conduction current flowing through the drain to the source of the MOS device 200. When there is conduction current flowing through the MOS device 200 during the measurement, which is also supported by the pulse generator, the output voltage level from the pulse generator will be altered by the conduction current and cannot be well controlled any more as originally designed. As a result, the high level difference ΔV cannot be correctly calculated to extract the correct intrinsic capacitance $C_{GD}$ or $C_{GS}$.

Therefore, we use DC bias, instead, for the first and second input signals. The output level from a DC power supply will not be influenced by the output current. However, when the DC bias is used, instead, for the first and second input signals, there will be some negative charges already existing at the first terminal G before the first terminal G is charged up by the capacitance measurement circuit, which is induced by the positive bias at the second terminal D through an overlap capacitance $C_{GD,overlap}$ of the MOS device 200 between the first and second terminals G and D. Consequently, the calculated intrinsic capacitance $C_{GD}$ between the first terminal G and the second terminal D according to the first current I1, the second current I2 and the high level difference ΔV between the first input signal S1 and the second input signal S2, as mentioned above, will be lower than what it should be by an overlap capacitance between the first and second terminals G and D. We can get the correct intrinsic capacitance $C_{GD}$ by adding the overlap capacitance $C_{GD,overlap}$ back.

Figure 5:
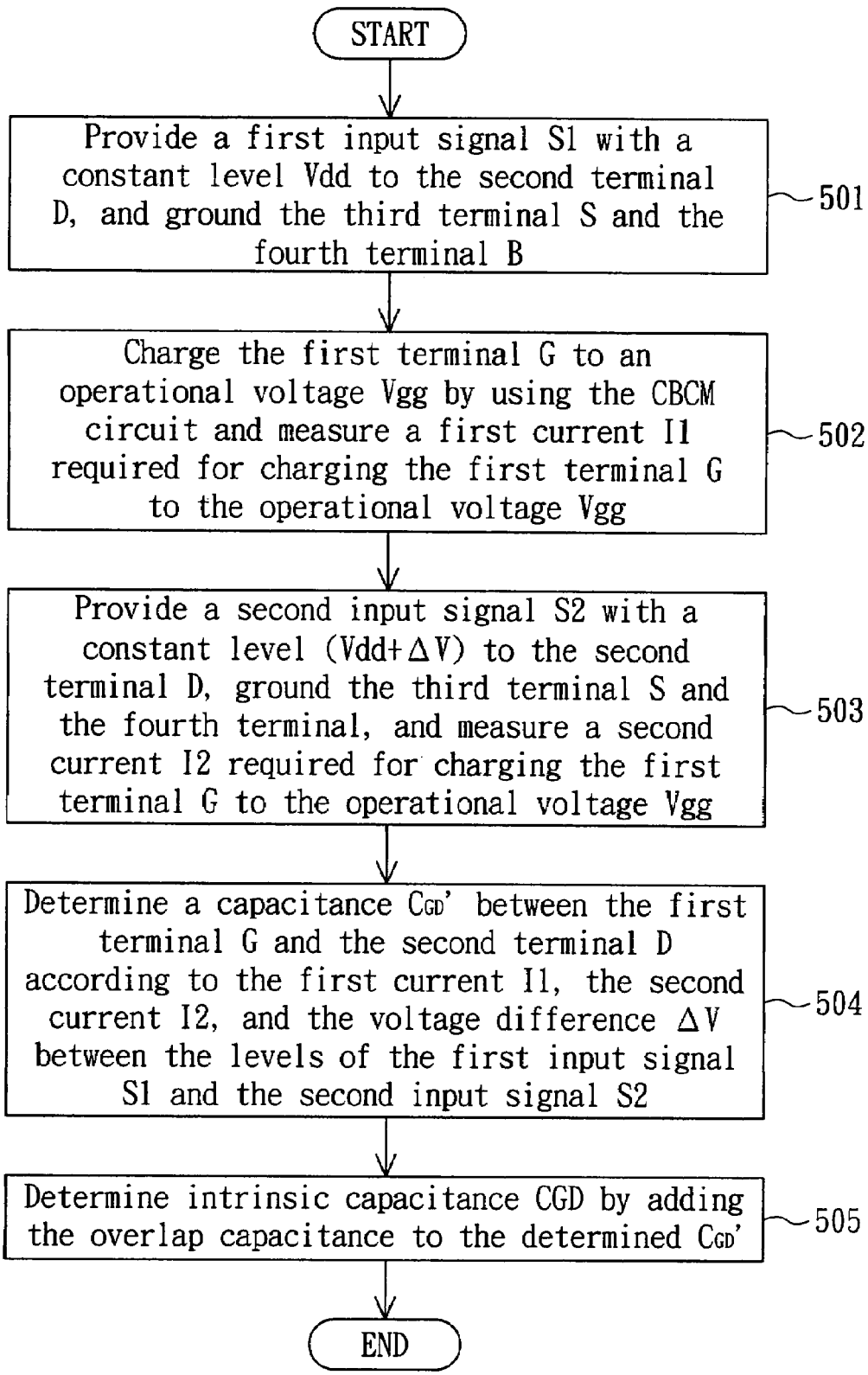
FIG. 5 is a flow chart of a method for measuring intrinsic capacitance $C_{GD}$ of a MOS device according to the first embodiment of the invention considering the effect of overlap capacitance.

Referring to FIG. 5, a flow chart of a method for measuring intrinsic capacitance $C_{GD}$ of a MOS device according to the first embodiment of the invention considering the effect of overlap capacitance $C_{GD,overlap}$ is shown. First, in step 501, provide a first input signal S1 with a constant level Vdd to the second terminal D, and ground the third terminal S and the fourth terminal B.

Following that, in step 502, charge the first terminal G to the operational voltage Vgg by using the CBCM circuit 210 and measure a first current I1 required for charging the first terminal G to the operational voltage Vgg. In the real case, the value I1/f, added by the negative charges induced by the positive voltage Vdd through the overlap capacitance $C_{GD,overlap}$ is a sum of the charge amount $Q_G$ accumulated at the first terminal G and the charge amount accumulated on the parasitic capacitor Cpar when the bias $V_G$ of the first terminal G reaches Vgg in one period. That is:

$$I1/f - C_{GD,overlap} \cdot Vdd = \int_0^{Vgg} C_{par} dV_G + Q_G \bigg| Vgg, Vdd$$

Afterward, in step 503, provide a second input signal S2 with a constant level (Vdd+ΔV) to the second terminal D, keep the third terminal S and the fourth terminal B grounded, similarly, actuate the CBCM circuit 210 to charge the first terminal G to the operational voltage Vgg and measure a second current I2 required for charging the first terminal G. Similar to the above-mentioned equation of I1, I2 can be obtained by:

$$I2/f - C_{GD,overlap} \cdot (Vdd + \Delta V) = \int_0^{Vgg} C_{par} dV_G + Q_G \bigg| Vgg, Vdd + \Delta V$$

Next, in step 504, according to the first current I1, the second current I2, and the voltage difference ΔV between the levels of the first input signal S1 and the second input signal S2, determine a capacitance $C_{GD}'$ (a combination of the intrinsic capacitance $C_{GD}$ and the overlap capacitance $C_{GD,overlap}$) between the first terminal G and the second terminal D. According to the above equations, the following equation can be obtained:

$$-\frac{I2 - I1}{f \times \Delta V} = -\frac{\Delta Q_G |_{Vgg,Vdd}}{\Delta V} - C_{GD,overlap}; = C_{GD} | Vgg,$$
$$Vdd - C_{GD,overlap} = C_{GD}'$$

Finally, in step 505, determine the intrinsic capacitance $C_{GD}$ by adding back the overlap capacitance $C_{GD,overlap}$ to the capacitance $C_{GD}'$.

Figure 6:
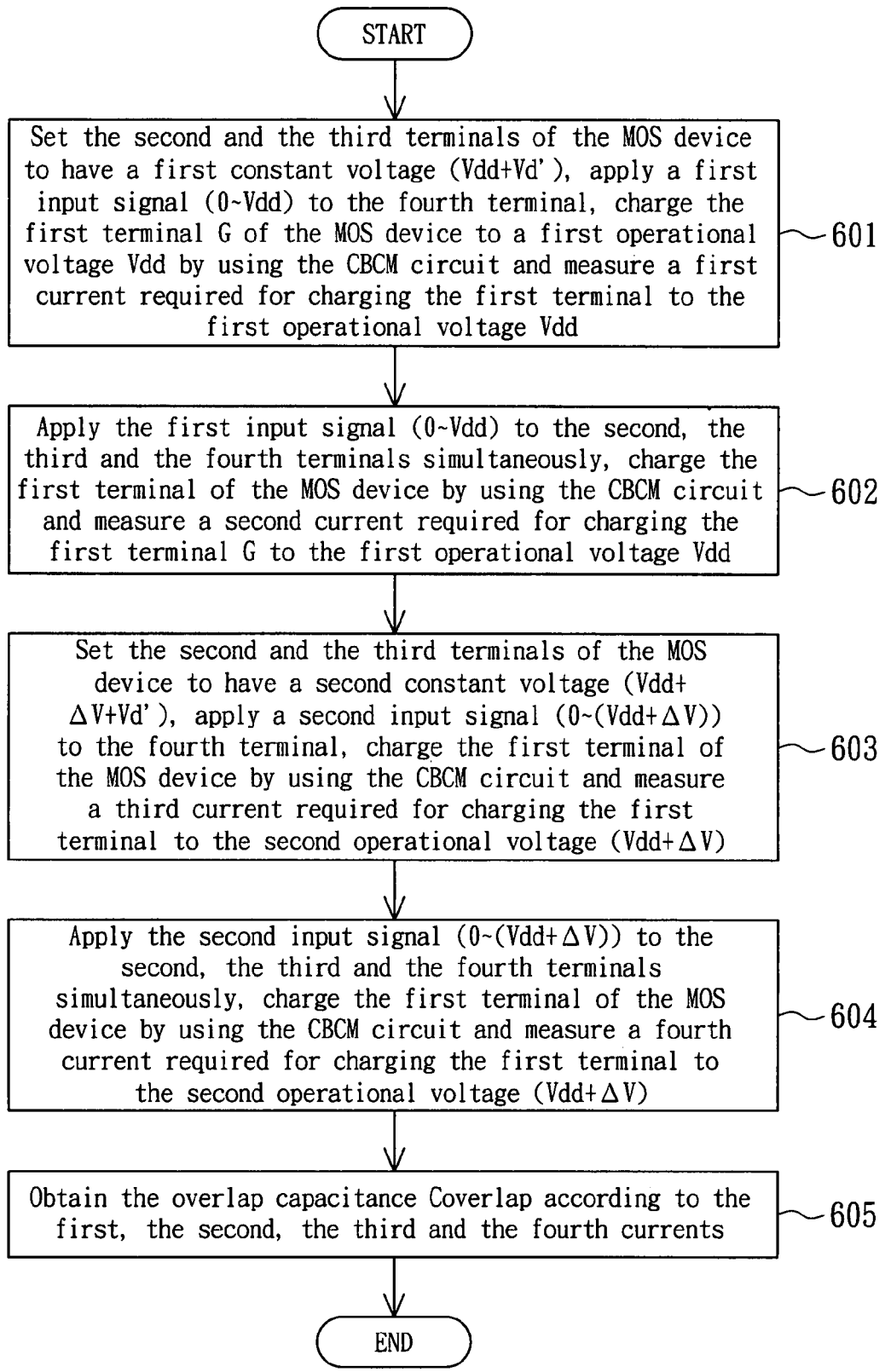
FIG. 6 is a flow chart of a method for obtaining the overlap capacitance $C_{overlap}$ according to the first embodiment of the invention.

The overlap capacitance $C_{GD,overlap}$ can be obtained by the following steps. Referring to FIG. 2A and FIG. 6 which is a flow chart of a method for obtaining the overlap capacitance $C_{overlap}$, first, in step 601, set the second and the third (the same mistake also exists in FIG. 6, the flow chart) terminals D and S of the MOS device 200 to have a first constant voltage (Vdd+Vd'), apply the first input signal S1 (0~Vdd) to the fourth terminal B, charge the first terminal G of the MOS device 200 to the first operational voltage Vdd by using the CBCM circuit 210 and measure a first current I1 required for charging the first terminal G to the first operational voltage Vdd.

$$I1/f = \int_0^{Vdd} C_{par} dV_G + 2 \cdot \int_{-Vd'}^{Vdd-Vd'} C_{overlap} dV_G$$

Following that, in step 602, apply the first input signal S1 (0~Vdd) to the second, the third and the fourth terminals D, S and B simultaneously, charge the first terminal G of the MOS device 200 by using the CBCM circuit 210 and measure a second current I2 required for charging the first terminal G to the first operational voltage Vdd.

$$I2/f = \int_0^{Vdd} C_{par} dV_G$$

Then, in step 603, set the second and the third terminals D and S of the MOS device 200 to have a second constant voltage (Vdd+ΔV+Vd'), apply the second input signal S2 (0~(Vdd+ΔV)) to the fourth terminal B, charge the first terminal G of the MOS device 200 by using the CBCM circuit 210 and measure a third current I3 required for charging the first terminal G to the second operational voltage (Vdd+ΔV).

$$I3/f = \int_0^{Vdd+\Delta V} C_{par} dV_G + 2 \cdot \int_{-Vd'}^{Vdd+\Delta V-Vd'} C_{overlap} dV_G$$

Finally, in step 604, apply the second input signal S2 (0~(Vdd+ΔV)) to the second, the third and the fourth terminals D, S and B simultaneously, charge the first terminal G of the MOS device 200 by using the CBCM circuit 210 and measure a fourth current I4 required for charging the first terminal G to the second operational voltage (Vdd+ΔV).

$$I4/f = \int_0^{Vdd+\Delta V} C_{par} dV_G$$

Therefore, the overlap capacitance $C_{overlap}$ can be obtained according to the first, the second, the third and the fourth currents I1, I2, I3 and I4 by the following calculation.

$$(I1-I2)/(2f) = \int_{-Vd'}^{Vdd-Vd'} C_{overlap} dV_G;$$

$$(I3-I4)/(2f) = \int_{-Vd'}^{Vdd+\Delta V-Vd'} C_{overlap} dV_G;$$

$$\frac{I_3-I_4-(I_1-I_2)}{2 \cdot f \cdot \Delta V} =$$

$$\frac{\int_{Vdd-V_d'}^{Vdd+\Delta V-V_d'} C_{overlap}(V')dV'}{\Delta V} \cong C_{overlap} \Big|_{V_G=0V, V_D=Vd'-Vdd}$$

Second Embodiment

According to the first embodiment, the intrinsic capacitance $C_{GD}$ is obtained by using the values I1, I2 and the related value ΔV. However, in order to obtain the intrinsic capacitance $C_{GG}$ of the first terminal G, changing the bias voltage $V_G$ of the first terminal G will result in different distributions from the values I1 and I2 to the parasitic capacitance Cpar. That is, the difference between the values I1 and I2 before and after the change will include an effect of the parasitic capacitance Cpar.

Figure 7:
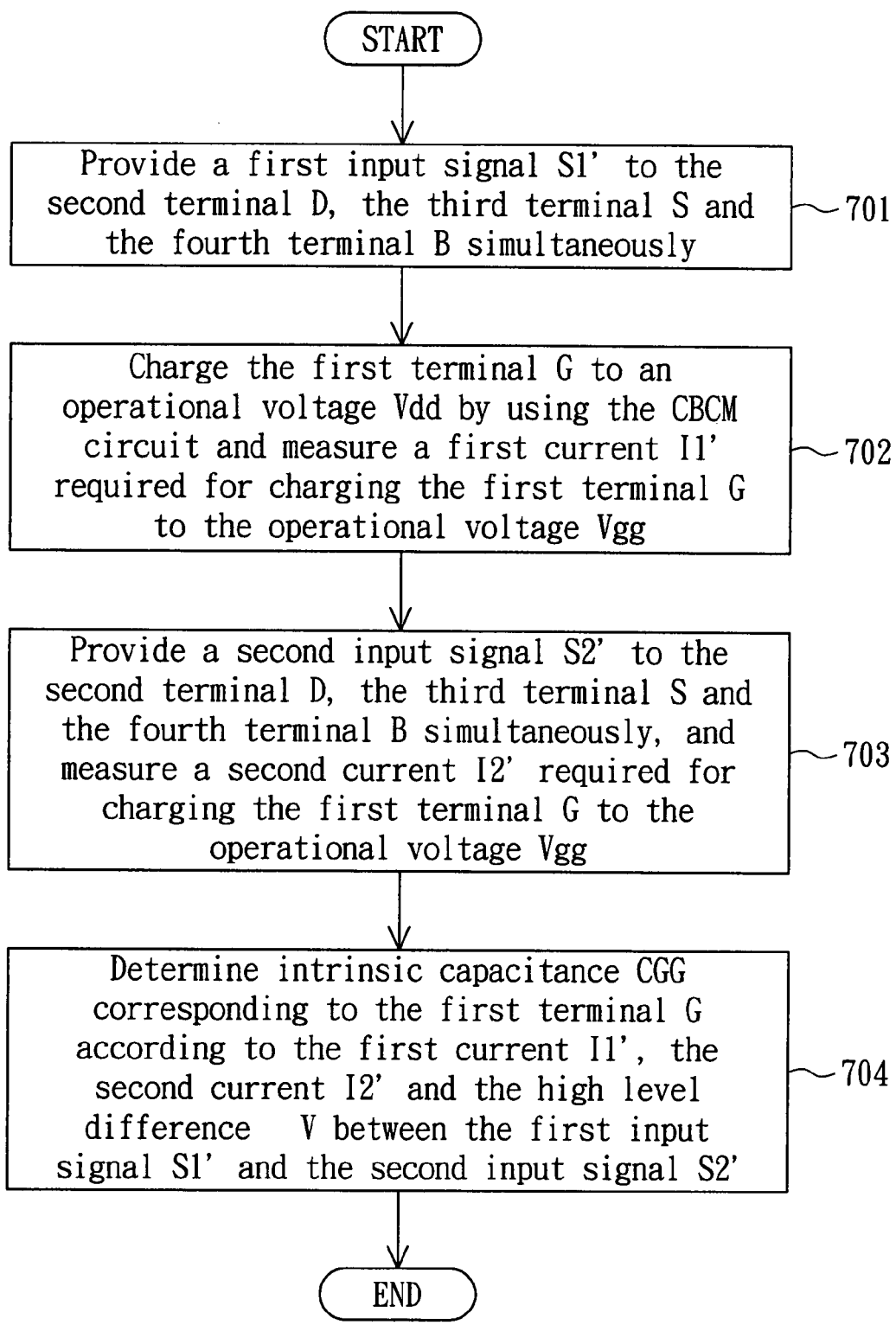
FIG. 7 is a flow chart of the method for measuring another intrinsic capacitance $C_{GG}$ of a MOS device according to the second embodiment of the invention.

Referring to FIG. 7, a flow chart of the method for measuring another intrinsic capacitance $C_{GG}$ of the MOS device 200 according to the second embodiment of the invention is shown. The difference between the second embodiment and the first embodiment lies on the first and second input signals S1'/S2' are provided to the second terminal D, and the third terminal S and the fourth terminal B simultaneously.

First, in step 701, provide a first input signal S1' to the second terminal D, the third terminal S and the fourth terminal B simultaneously. Following that, in step 702, charge the first terminal G to an operational voltage Vdd by using the CBCM circuit 210 and measure a first current I1' required for charging the first terminal G to the operational voltage Vgg. In step 703, provide a second input signal S2' to the second terminal D, the third terminal S and the fourth terminal B simultaneously, and measure a second current I2' required for charging the first terminal G to the operational voltage Vgg. The first input signal S1' and the second input signal S2' have the same low level but different high levels. The difference between the high levels of the first input signal S1' and the second input signal S2' is equal to V. That is, the other three terminals D, B and S are biased by a small amount V except for the first terminal G and the value Vgg is kept unchanged. By doing so, the effect is equivalent to the situation that the bias voltage $V_G$ of the first terminal G is varied by the amount V. The values S1' and S2' are exemplified to be the same value f, and thus in the steps 702 and 703, I1' and I2' can be obtained by:

$$I1'/f = \int_0^{Vgg} C_{par} dV_G + \int_0^{Vgg} C_{GG} dV_G \Big|_{Vdd} =$$

$$\int_0^{Vgg} C_{par} dV_G + Q_G \Big| VG = Vgg - Vdd;$$

$$I2'/f = \int_0^{Vgg} C_{par} dV_G + \int_0^{Vgg} C_{GG} dV_G \Big|_{Vdd+\Delta V} =$$

$$\int_0^{Vgg} C_{par} dV_G + Q'_G \Big| VG = Vgg - V - Vdd$$

It should be noted that the value $Q_G$ is corresponding to the case in which the operational voltage is (Vgg-Vdd). Finally, in step 704, determine intrinsic capacitance $C_{GG}$ corresponding to the first terminal G according to the first current I1', the second current I2' and the high level difference V between the first input signal S1' and the second input signal S2'. Similar to the calculation of the first embodiment, the value $C_{GG}$ can be obtained by:

$$C_{GG} | VG =$$

$$Vgg - Vdd = \frac{\partial Q_G}{\partial V_G}\Big|_{VG=Vgg-Vdd} \approx \frac{\Delta Q_G |_{VG=Vgg-Vdd}}{\Delta V} = (I1' - I2')/(f \times V)$$

Figure 8:
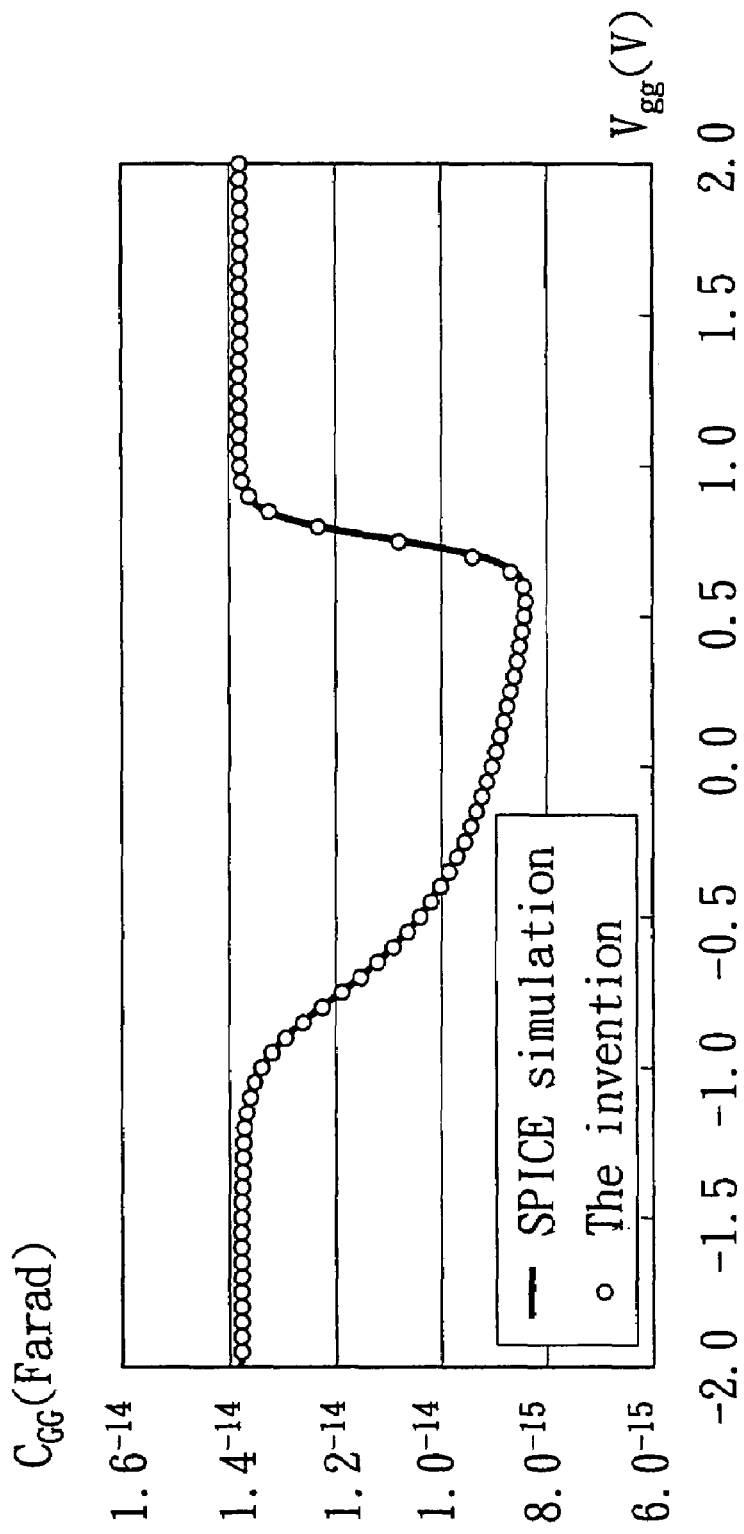
FIG. 8 is a comparison diagram of the values $C_{GG}$ respectively obtained by the measuring method of the second embodiment of the invention and that resulted from SPICE simulation.

Referring to FIG. 8, a comparison diagram of the values $C_{GG}$ respectively obtained by the measuring method of the second embodiment of the invention and that resulted from SPICE simulation is shown. As shown in FIG. 8, the value $C_{GG}$ obtained by the above equation (I1'-I2')/(f×V) is almost the same as the SPICE simulation result.

Any one who is familiar with the related art will recognize that the skill of the invention is not limited thereto. The operational voltage or bias voltage at every terminal can be set to have a suitable value as needed in order to obtain enough data information for the next-stage model analysis. Besides, the first current or the second current can also be obtained by averaging the currents measured in a number of periods. Moreover, although the measuring method of the invention measures the current flowing by the PMOS transistor in the above embodiment, obviously, the method can also be performed by measuring a current flowing by a NMOS transistor. As long as variation of a charging or discharging current generated due to small bias variation of terminals of the MOS device to be detected can be measured to determine the corresponding intrinsic capacitance, all these will not depart from the scope of the invention.

In the method for measuring intrinsic capacitance of a MOS device disclosed by the above embodiments of the invention, it needs only a normal capacitance measurement circuit, such as having a CBCM structure, to measure intrinsic capacitance, even that of a short-channel MOS device. Moreover, the obtained data from the invention is almost the same as the SPICE simulation result.

While the invention has been described by way of example and in terms of two preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for measuring intrinsic capacitance of a metal oxide semiconductor (MOS) transistor, the MOS transistor comprising a first terminal, a second terminal, a third terminal and a fourth terminal, the first to the fourth terminals being respectively a gate, a drain, a source and a bulk of the MOS transistor, the first terminal being coupled to a charge based capacitance measurement circuit (CBCM) comprising a p-type MOS (PMOS) transistor and an n-type MOS (NMOS) transistor, the PMOS transistor having a source coupled to an operational voltage and a drain coupled to a drain of the NMOS transistor and the first terminal, and the NMOS transistor having a source that is grounded, the method comprising:

(a) providing a first input signal to the second terminal and grounding the third terminal and the fourth terminal;

(b) charging the first terminal to the operational voltage by using the capacitance measurement circuit and measuring a first current required for charging the first terminal to the operational voltage;

(c) providing a second input signal to the second terminal, grounding the third terminal and the fourth terminal, and measuring a second current required for charging the first terminal to the operational voltage, wherein the first input signal and the second input signal have the same low level but different high levels; and (d) determining intrinsic capacitance between the first terminal and the second terminal according to the first current, the second current and a high level difference between the first input signal and the second input signal.

2. The method according to claim 1, wherein step (a) comprises:

respectively providing a first control signal and a second control signal to a gate of the PMOS transistor and a gate of the NMOS transistor to enable the PMOS transistor and the NMOS transistor by turns, wherein the first control signal and the second control signal have the same frequency.

3. The method according to claim 2, wherein the first control signal, the first input signal and the second input signal have the same frequency, the first control signal and the second control signal have the same high level, the first control signal, the first input signal and the second input signal have a low level equal to 0, and when the PMOS transistor is enabled, the first input signal and the second input signal have the high level; when the NMOS transistor is enabled, the first input signal and the second input signal have the low level.

4. The method according to claim 3, wherein the first control signal has a frequency f, the first current is I1, the second current is I2, difference between high levels of the second input signal and the first input signal is $\Delta V$, and in the step (d), the intrinsic capacitance between the first terminal and the second terminal is $(I1-I2)/(f \times \Delta V)$.

5. The method according to claim 1, wherein the first input signal and second input signal have constant and different levels, and the step (d) further comprising:

determining a capacitance between the first terminal and the second terminal according to the first current, the second current and the level difference of the first input signal and the second input signal; and determining the intrinsic capacitance by adding an overlap capacitance between the first terminal and the second terminal to the determined capacitance.

6. The method according to claim 5, wherein the step of determining the intrinsic capacitance comprises:

setting the second and the third terminals of the MOS device to have a first constant voltage (Vdd+Vd'), applying a first input signal (0~Vdd) to the fourth terminal, charging the first terminal to a first operational voltage Vdd by using the capacitance measurement circuit and measuring a first current required for charging the first terminal to the first operational voltage;

applying the first input signal (0~Vdd) to the second, the third and the fourth terminals simultaneously, charging the first terminal to the first operational voltage Vdd by using the capacitance measurement circuit and measuring a second current required for charging the first terminal to the first operational voltage;

setting the second and the third terminals of the MOS device to have a second constant voltage (Vdd+$\Delta V$+Vd'), applying a second input signal (0~(Vdd+$\Delta V$)) to the fourth terminal, charging the first terminal to a second operational voltage (Vdd+$\Delta V$) by using the capacitance measurement circuit and measuring a third current required for charging the first terminal to the second operational voltage; and applying the second input signal (0~(Vdd+$\Delta V$)) to the second, the third, and the fourth terminals simultaneously, charging the first terminal to the second operational voltage (Vdd+$\Delta V$) by using the capacitance measurement circuit and measuring a fourth current I4 required for charging the first terminal to the second operational voltage; and obtaining the overlap capacitance according to the first, the second, the third and the fourth currents.

7. A method for measuring an intrinsic capacitance of a MOS device, the MOS device comprising a first terminal, a second terminal, a third terminal, and a fourth terminal, the first to the fourth terminals being respectively a gate, a drain, a source and a bulk of the MOS transistor, the first terminal being coupled to a charge based capacitance measurement circuit (CBCM) comprising a p-type MOS (PMOS) transistor and an n-type MOS (NMOS) transistor, the PMOS transistor having a source coupled to an operational voltage and a drain coupled to a drain of the NMOS transistor and the first terminal, and the NMOS transistor having a source that is grounded, the method comprising:

(a) providing a first input signal to the second terminal, the third terminal and the fourth terminal simultaneously;

(b) charging the first terminal to the operational voltage by using the capacitance measurement circuit and measuring a first current required for charging the first terminal to the operational voltage;

(c) providing a second input signal to the second terminal, the third terminal and the fourth terminal simultaneously, and measuring a second current required for charging the first terminal to the operational voltage, wherein the first input signal and the second input signal have the same low level but different high levels and a difference between high levels of the first input signal and the second input signal is equal to the first voltage; and (d) determining intrinsic capacitance of the first terminal according to the first current, the second current and the first voltage.

8. The method according to claim 7, wherein step (a) comprises:

respectively providing a first control signal and a second control signal to a gate of the PMOS transistor and a gate of the NMOS transistor to enable the PMOS transistor and the NMOS transistor by turns, wherein the first control signal and the second control signal have the same frequency.

9. The method according to claim 8, wherein the first control signal, the first input signal and the second input signal have the same frequency, the first control signal and the second control signal have the same high level, the first control signal, the first input signal and the second input signal have a low level equal to 0, and when the PMOS transistor is enabled, the first input signal and the second input signal have the high level; when the NMOS transistor is enabled, the first input signal and the second input signal have the low level.

10. The method according to claim 9, wherein the first control signal has a frequency f, the first current is I1, the second current is I2, the first voltage is $\Delta V$, and in the step (d), the intrinsic capacitance of the first terminal is $(I1-I2)/(f \times \Delta V)$.

* * * * *